(12) United States Patent
Lim

(10) Patent No.: US 8,119,433 B2
(45) Date of Patent: Feb. 21, 2012

(54) IMAGE SENSOR AND FABRICATING METHOD THEREOF

(75) Inventor: Keun-Hyuk Lim, Songpa-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 352 days.

(21) Appl. No.: 12/344,450

(22) Filed: Dec. 26, 2008

(65) Prior Publication Data

US 2009/0166776 A1  Jul. 2, 2009

(30) Foreign Application Priority Data

Dec. 27, 2007 (KR) .................. 10-2007-0139390

(51) Int. Cl.
*H01L 21/00* (2006.01)
(52) U.S. Cl. .......................... 438/57; 438/455
(58) Field of Classification Search .................. 438/57, 438/59, 455, 459
See application file for complete search history.

(56) References Cited

U.S. PATENT DOCUMENTS

| 5,936,261 | A | * | 8/1999 | Ma et al. | 257/59 |
| 2009/0065828 | A1 | * | 3/2009 | Hwang | 257/292 |
| 2009/0174025 | A1 | * | 7/2009 | Hwang | 257/463 |

* cited by examiner

*Primary Examiner* — Bradley K Smith
(74) *Attorney, Agent, or Firm* — Sherr & Vaughn, PLLC

(57) ABSTRACT

An image sensor includes an insulating interlayer including a metal line on a semiconductor substrate, a photodiode pattern provided on the insulating interlayer to be connected to the metal line, the photodiode pattern separated per unit pixel by a gap area, a device isolation insulating layer provided on the insulating interlayer including the photodiode pattern and the gap area, a contact hole provided to the device isolation insulating layer to expose the photodiode pattern and a neighbor photodiode pattern, and a contact plug provided to the contact hole to be connected to a plurality of the photodiode patterns.

14 Claims, 5 Drawing Sheets

IMAGE SENSOR AND FABRICATING METHOD THEREOF

Figure 1:
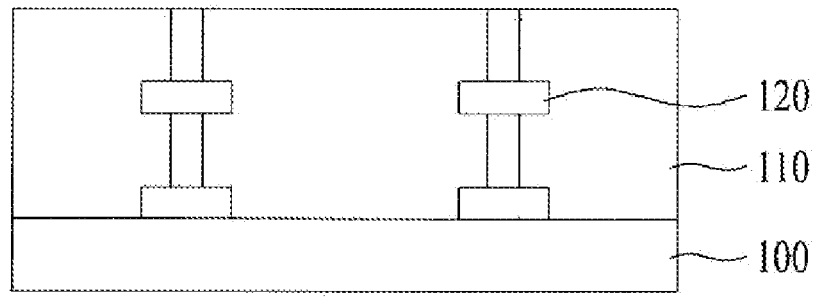

The present application claims priority under 35 U.S.C. 119 to Korean Patent Application No. 10-2007-0139390 (filed on Dec. 27, 2007), which is hereby incorporated by reference in its entirety.

BACKGROUND

Generally, an image sensor is a semiconductor device that converts an optical image to an electrical signal and they can be classified as either a charge coupled device (CCD) image sensor or a Complementary Metal Oxide Silicon (CMOS) image sensor (CIS). The CMOS image sensors adopt a switching system by providing a photodiode and MOS transistor within a unit pixel and then implements an image by detecting electrical signals of unit pixels sequentially. In a related CMOS image sensor, a photodiode area for converting an optical signal to an electric signal and a transistor area for processing the electric signal are arranged in a horizontal plane.

In a horizontal type CMOS image sensor, a photodiode and a transistor are formed adjacent each other on a substrate in a horizontal direction. However, in this type of arrangement, an additional area for forming the photodiode is utilized. Therefore, a fill factor area is reduced and the possible resolution is limited.

SUMMARY

Embodiments relate to an image sensor, and fabricating method thereof, that includes a transistor circuit and photodiode which can be vertically integrated. Embodiments also relate to an image sensor and fabricating method thereof, by which both resolution and sensitivity can be maximized. Embodiments relate to an image sensor and fabricating method thereof, by which defects within a photodiode can be minimized while adopting a vertical type photodiode.

Embodiments relate to an image sensor that includes an insulating interlayer including a metal line on a semiconductor substrate, a photodiode pattern provided on the insulating interlayer to be connected to the metal line, the photodiode pattern separated per unit pixel by a gap area, a device isolation insulating layer provided on the insulating interlayer including the photodiode pattern and the gap area, a contact hole provided to the device isolation insulating layer to expose the photodiode pattern and a neighbor photodiode pattern, and a contact plug provided to the contact hole to be connected to a plurality of the photodiode patterns.

Embodiments relate to a method of fabricating an image sensor that includes forming an insulating interlayer including a metal line on a semiconductor substrate, forming a crystalline semiconductor layer including a photodiode, bonding the crystalline semiconductor layer and the semiconductor substrate together, leaving the photodiode on the semiconductor substrate by removing the crystalline semiconductor layer, forming a photodiode pattern connected to the metal line each by forming a gap area in the photodiode, forming a device isolation insulating layer on the insulating interlayer including the photodiode pattern and the gap area, forming a contact hole in the device isolation insulating layer to expose both of the photodiode pattern and a neighbor photodiode pattern, and forming a contact plug in the contact hole.

Embodiments relate to an image sensor that may provide vertical integration of transistors and photodiodes and that may have a fill factor of about 100% because of vertical integration of transistor circuitry and photodiodes. Embodiments relate to an image sensor that may maximize sensitivity per pixel size, may minimize process costs per resolution factor; may allow complicated circuitry without reduction of sensitivity, may maximize performance of an image sensor, may minimize size, may minimize fabrication costs, and may minimize defects generated within the photodiode.

DRAWINGS

Example FIGS. 1 to 10 are cross-sectional diagrams for a method of fabricating an image sensor according to embodiments.

DESCRIPTION

Figure 9:
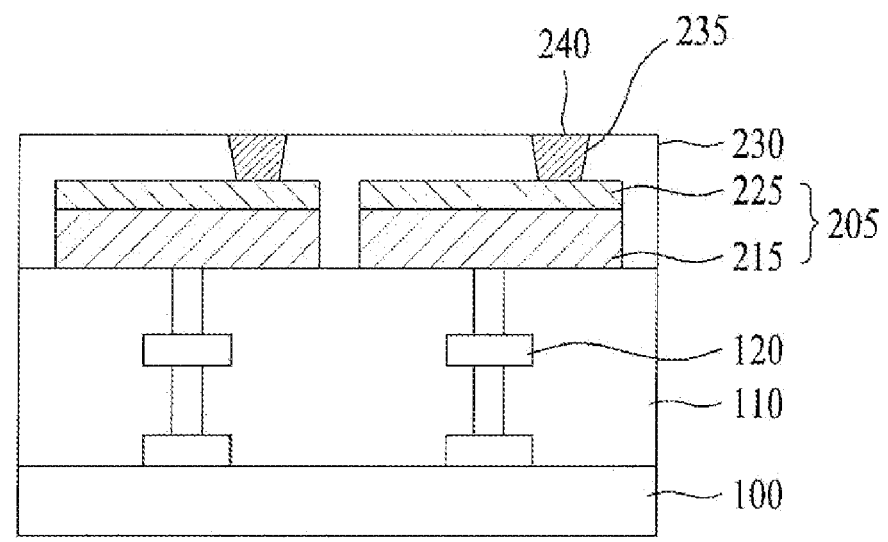
Figure 10:
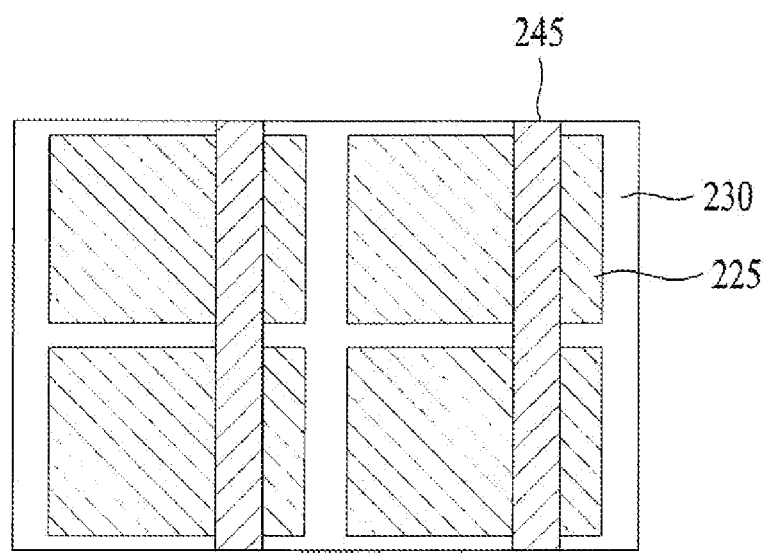

Example FIG. 9 is a cross-sectional diagram of an image sensor according to embodiments and example FIG. 10 is a layout of an image sensor according to embodiments. Referring to example FIG. 9, an image sensor includes an insulating interlayer 110 including a metal line 120 formed on, or over, a semiconductor substrate 100, a photodiode pattern 205 provided on, or over, the insulating interlayer 110 to be connected to the metal line 120, the photodiode pattern 205 separated into unit pixels by a gap area 207, a device isolation insulating layer 230 provided on, or over, the insulating interlayer 110 including the photodiode pattern 205 and the gap area 207, a contact hole 235 in the device isolation insulating layer 230 to expose the photodiode pattern 205 and a neighbor photodiode pattern 205, and a contact plug 245 in the contact hole 235 to be connected to a plurality of the photodiode patterns 205.

The contact hole 235 may configured in a long trench shape to expose a plurality of the photodiode patterns 205 formed per unit pixel. Hence, the contact plug 245, as shown in example FIG. 10, may be able to connect a plurality of the neighbor photodiode patterns together. For example, the contact plug 245 can be formed of tungsten or other metal, alloy, silicide or electrically conductive material. Since the contact plug 245 may be connected to a plurality of the photodiode patterns 205, device integration can be enhanced without forming an upper metal line used as a ground contact of the photodiode pattern 205. Additional CMOS circuitry can be provided per unit pixel to the semiconductor substrate 100 to process photocharges generated from the photodiode pattern 205. Because the photodiode may be formed by implanting ions in a crystalline semiconductor layer, it may be possible to minimize defects of the photodiode pattern 205.

According to embodiments, vertical integration of image sensor can be achieved in a manner by forming the photodiode on, or over, the semiconductor substrate including the metal line. Moreover, the photodiodes may be isolated per unit pixel by the gap area and an insulating layer in the gap area. Therefore, crosstalk and noise generation may be eliminated or minimized. Also, because the photodiode is formed within the crystalline semiconductor substrate, it is able to minimize defects of the photodiode.

Example FIGS. 1 to 10 are cross-sectional diagrams for a method of fabricating an image sensor according to embodiments. Referring to example FIG. 1, an insulating interlayer 110 and a metal line 120 may be formed on, or over, a semiconductor substrate 100. The semiconductor substrate 100 may include a single crystalline silicon substrate and may include a substrate doped with p or n type impurity. A device isolation layer can be formed on the semiconductor substrate 100 to define an active area and a field area. A transistor structure including transfer, rest, drive and select transistors can be provided per unit pixel to the active area to convert received photocharges to an electric signal by being connected to a photodiode explained later. The transistor structure can be configured in one of 3Tr, 4Tr and 5Tr types.

A metal line 120 for connecting circuitry to a power line (or a signal line) and an insulating interlayer 110 may be formed over the semiconductor substrate 100. In this case, the metal line 120 and the insulating interlayer 110 may be configured plurally. The metal line 120 formed over the semiconductor substrate 100 may be formed per unit pixel and may connect the photodiode 200 and the circuitry together. Hence, the metal line 120 may play a role in transferring photocharges of the photodiode.

The metal line 120 can include a plug and can be formed from at least one of various electrically conductive substances including metals, alloys and silicides. For instance, the metal line 120 can be formed of Al, Cu, Co or W. According to embodiments, the plug of the metal line 120 can be projected from a surface of the insulating interlayer 110. Thus, the crystalline semiconductor layer 20 including the photodiode 200 may be formed over the semiconductor substrate 100 including the metal line 120 and the insulating interlayer 110.

Figure 2:
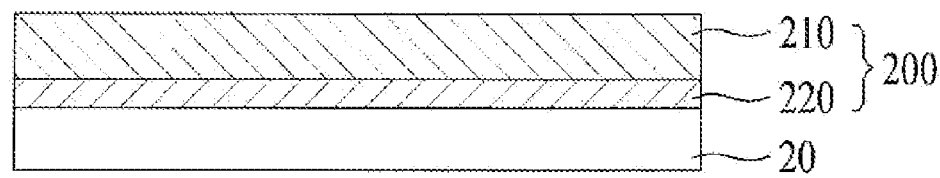

Referring to example FIG. 2, a carrier layer including the crystalline semiconductor layer 20 may be prepared. The carrier substrate may be either a single-crystalline or polycrystalline silicon substrate and may be a substrate doped with n or p type impurity. The crystalline semiconductor layer 20 may be provided on or beneath the carrier substrate. The crystalline semiconductor layer 20 may have either a single-crystalline or polycrystalline structure and may be a substrate doped with p or n type impurity. According to embodiments, the crystalline semiconductor layer 20 can be an upper area of the carrier substrate; or the crystalline semiconductor layer 20 can be an epi-layer of the carrier substrate; or the crystalline semiconductor layer 20 can be the carrier substrate itself. In particular, the crystalline semiconductor layer 20 can be a p-type substrate, for example.

Photodiode 200 may be formed within the crystalline semiconductor layer 20. The photodiode 200 may include a first conductive area 210 and a second conductive area 220. The first conductive area 210 can be provided to an upper area within the crystalline semiconductor layer 20. For instance, the first conductive area 210 can be formed by n-type impurity ion implantation. The second conductive area 220 can be provided to a lower area of the crystalline semiconductor layer 20. For instance, the second conductive area 220 can be formed by p-type impurity ion implantation. Because the second conductive area 220 may be formed under the first conductive area 210, the photodiode 200 can have a PN junction structure. In this case, the first conductive area 210 can be configured to have a thickness greater than that of the second conductive area 220, which may be advantageous in generating photocharges.

Figure 3:
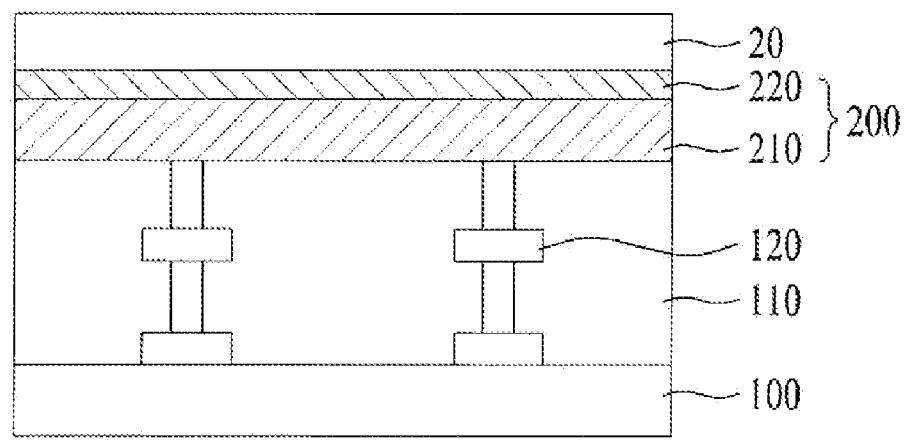

Referring to example FIG. 3, a crystalline semiconductor layer 20 including a photodiode may be bonded to the semiconductor substrate 100 including the metal line 120. The semiconductor substrate 100 and the crystalline semiconductor layer 20 can be bonded together by bonding. In particular, after a surface of the second conductive area 220 of the photodiode 200 has been superposed on the insulating interlayer 110 of the semiconductor substrate 100, the bonding process can be performed. Thus, the crystalline semiconductor layer 20 including the photodiode 200 can be bonded to the topside of the insulating interlayer 110 of the semiconductor substrate 100. As a result, the semiconductor substrate 100 and the photodiode may be vertically integrated and thereby, maximize a fill factor.

Figure 4:
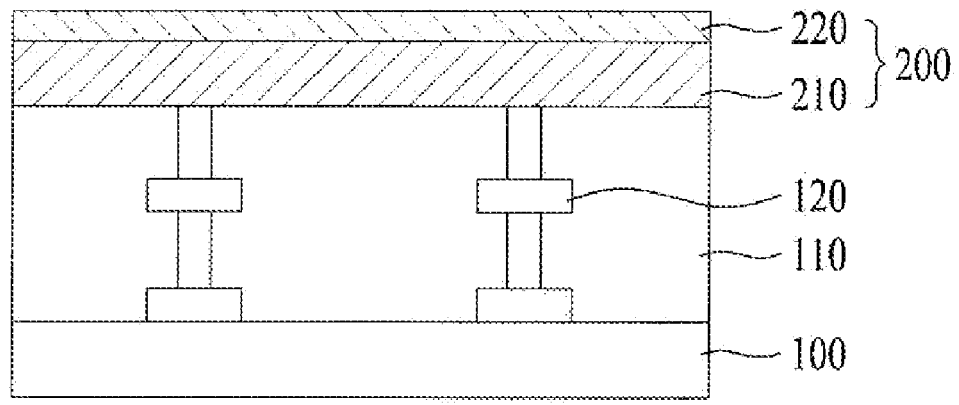

Referring to example FIG. 4, the crystalline semiconductor layer 20 may be removed in a manner so that the photodiode 200 may remain on the semiconductor substrate 100. Because the photodiode 200 may remain over the metal line 120 of the semiconductor substrate 100, the metal line 120 and the photodiode 200 may be electrically connected.

Figure 5:
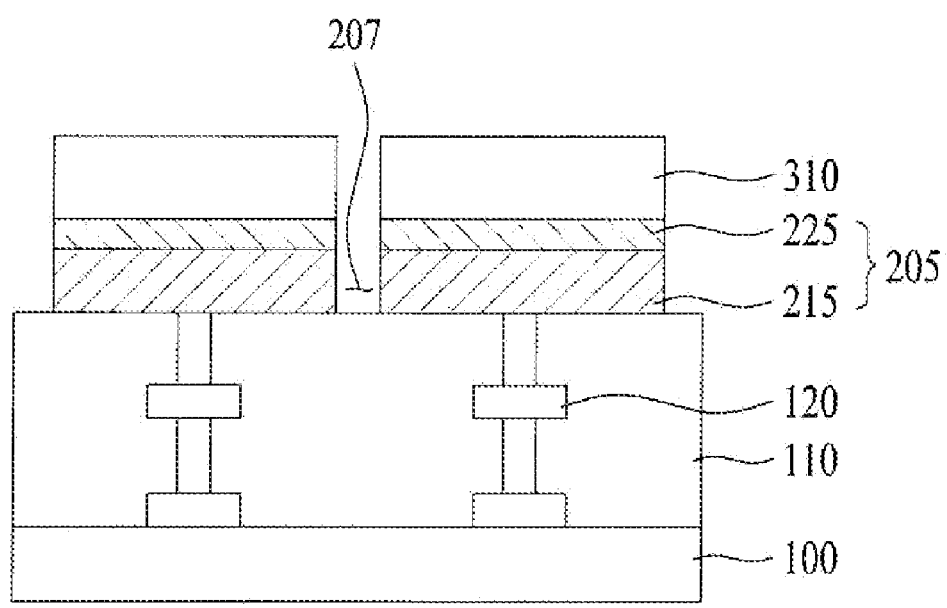

Referring to example FIG. 5, a photodiode pattern 205 may be formed by separating the photodiode 200 per unit pixel. In particular, the photodiode pattern 205 can be patterned to match the metal line 120. The photodiode pattern 205 may be separated by a gap area 207 to be formed per the unit pixel. The photodiode pattern 205 may include a first conductive area 215 and a second conductive area 225. In order to form the photodiode pattern 205, a first photoresist pattern 310 may be formed on the photodiode 200 so that it covers the crystalline semiconductor layer 20 corresponding to the metal line 120 and exposes the remaining area. The photodiode pattern 205 may then be formed by etching the crystalline semiconductor layer 20 using the first photoresist pattern 310 as an etch mask. A gap area 207 exposing a surface of the insulating interlayer 110 may be formed between the photodiode patterns 205. As a result, the photodiode pattern 205 may be separated per the unit pixel to be connected to the metal line 120 via the gap area 207.

Figure 6:
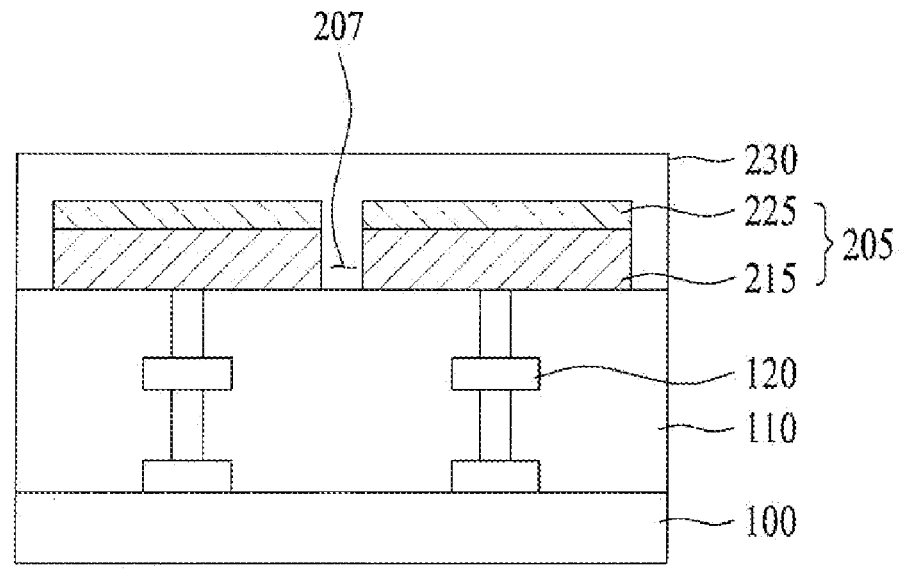

Referring to example FIG. 6, a device isolation insulating layer 230 may be formed on the photodiode pattern 205 and the gap area 207. The device isolation insulating layer 230 can be formed of oxide or nitride. The device isolation layer may be formed to fill the gap area 207 and may be able to isolate the photodiode patterns 205 from each other per the unit pixel. The device isolation insulating layer 230 can have a height greater than that of the photodiode pattern 205 to cover a surface of the photodiode pattern 205.

Figure 7:
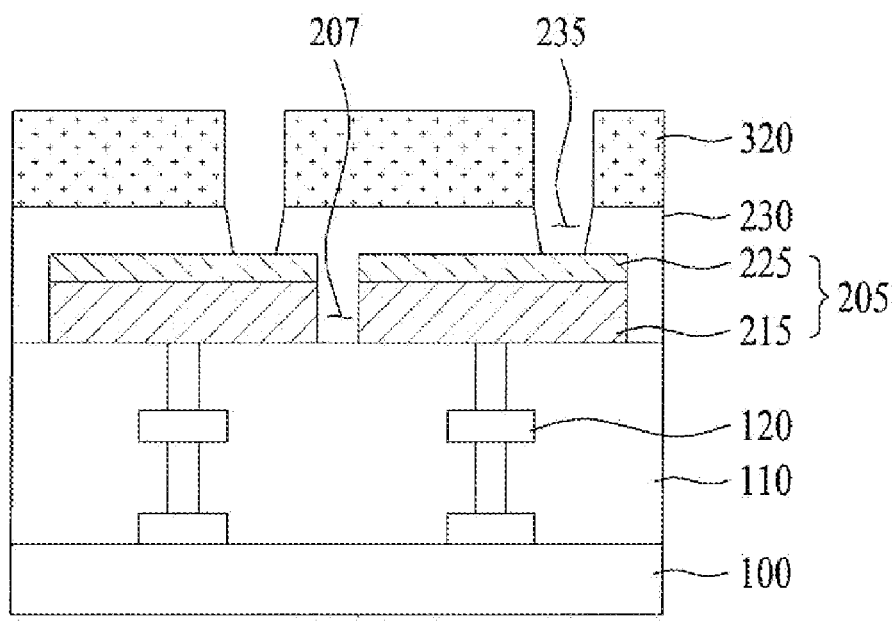

Referring to example FIG. 7, a contact hole 235 may be formed in the device isolation insulating layer 230 to selectively expose the photodiode pattern 205. Forming the contact hole 235 may include forming a second photoresist pattern 320 on the device isolation insulating layer 230 to selectively expose the device isolation insulating layer 230 corresponding to the photodiode pattern 205 and then etching the device isolation insulating layer 230 using the second photoresist pattern 320 as an etch mask. Accordingly, the contact hole 235 may be formed in the device isolation insulating layer 230 to selectively expose the photodiode pattern 205. The contact hole 235 can be formed in a long trench shape to be connected to neighboring contact holes as well.

Figure 8:
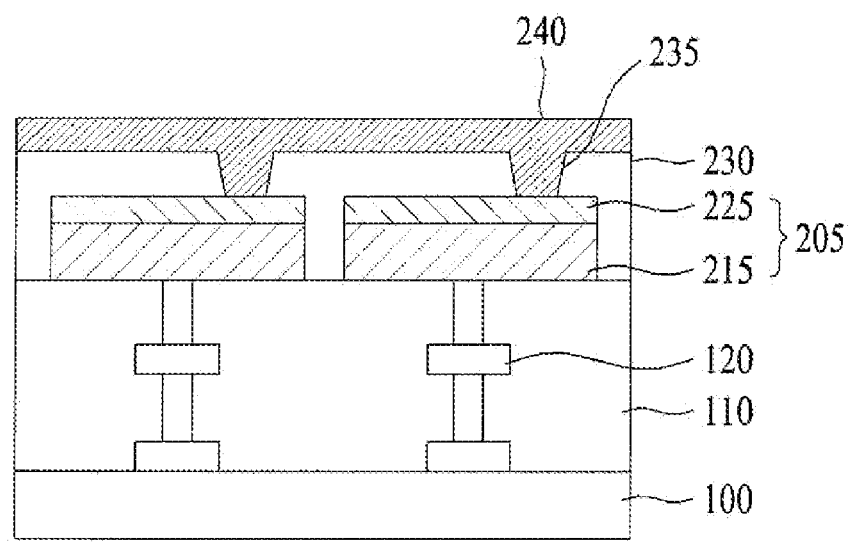

Referring to example FIG. 8 and example FIG. 9, a contact plug 245 may be formed in the contact hole 235. The contact plug 245 can be formed by depositing a metal substance 240 on the device isolation insulating layer 230 including the contact hole 235 and then planarizing the metal substance by chemical mechanical polishing (CMP). For example, the contact plug 245 can be formed of such a metal substance such as Co, Cu, Al and W, and alloys and silicides. Because the contact plug 245 may be formed within the contact hole 235, it may be electrically connected to the photodiode pattern 205. In particular, the contact plug 245 may be formed in the contact hole 235 configured in the long trench shape shown in example FIG. 10. According to embodiments, the contact plug 245 may operate so as to electrically connect the separated photodiode patterns 205. Therefore, the contact plug 245 for the ground contact connection of the photodiode patterns 205 separated from each other per the unit pixel can be formed by deposing the metal substance through a single contact mask and etch process. Because this may avoid a separate metal line process for the contact connection of the photodiode pattern 205, the overall process can be simplified.

Optionally, a color filter and a microlens can be formed over the semiconductor substrate 100 including the photodiode pattern 205 and the contact plug 245.

In a method of fabricating an image sensor according to embodiments, a semiconductor substrate including a metal line and a crystalline semiconductor layer including a photodiode can be bonded together by a bonding process to achieve vertical integration. Forming a photodiode over a semiconductor substrate may minimize a focus length of the photodiode and maximize a light-receiving rate. Also, additionally integrated on-chip circuitry can enhance performance of an image sensor, minimize the size of a device, and minimize fabrication costs.

According to embodiments, when a photodiode is formed by performing ion implantation on a single crystalline substrate in a vertical type photodiode, the generation of defects within the photodiode can be minimized. Also, because photodiodes may be separated per unit pixel by a device isolation insulating layer, crosstalk and noise may be minimized. Furthermore, when a photodiode separated per unit pixel is electrically connected by a single contact plug process, the process may be simplified and, thereby, maximize productivity.

It will be obvious and apparent to those skilled in the art that various modifications and variations can be made in the embodiments disclosed. Thus, it is intended that the disclosed embodiments cover the obvious and apparent the modifications and variations, provided that they are within the scope of the appended claims and their equivalents.

What is claimed is:

1. A method of fabricating an image sensor, comprising:
    forming an insulating interlayer including an electrically conductive line over a semiconductor substrate;
    forming a crystalline semiconductor layer including a photodiode;
    bonding the crystalline semiconductor layer and the semiconductor substrate together;
    leaving the photodiode on the semiconductor substrate by removing the crystalline semiconductor layer;
    forming a photodiode pattern connected to the electrically conductive line, the photodiode pattern separated per unit pixel by a gap area formed in the photodiode;
    forming a device isolation insulating layer on the insulating interlayer including the photodiode pattern and the gap area;
    forming a contact hole in the device isolation insulating layer to expose both of the photodiode pattern and a neighbor photodiode pattern; and
    forming a contact plug in the contact hole.

2. The method of claim 1, wherein the photodiode is formed by performing ion implantation on the crystalline semiconductor layer.

3. The method of claim 1, forming the contact plug forming includes:
    forming a photoresist pattern over the insulating interlayer to expose a plurality of the photodiode patterns;
    forming the contact hole exposing a plurality of the photodiode patterns by etching the device isolation insulating layer using the photoresist pattern as an etch mask;
    depositing a metal substance over the contact hole; and
    planarizing the deposited metal substance.

4. The method of claim 3, wherein planarizing comprises chemical mechanical polishing.

5. The method of claim 1, wherein the contact plug comprises tungsten.

6. The method of claim 1, wherein the contact hole is formed in a long trench shape to be connected to a neighbor contact hole.

7. The method of claim 1, wherein the photodiode pattern comprises a first conductive area and a second conductive area.

8. The method of claim 7, wherein the first conductive area is formed by n-type impurity ion implantation and wherein the second conductive area is formed by p-type impurity ion implantation.

9. The method of claim 7, wherein the second conductive area is formed under the first conductive area.

10. The method of claim 7, wherein the second conductive area is formed in a lower area of the crystalline semiconductor layer.

11. The method of claim 7, wherein the first conductive area is formed thicker than the second conductive area.

12. The method of claim 1, wherein the device isolation insulating layer is formed higher than the photodiode pattern to cover a surface of the photodiode pattern.

13. The method of claim 1, wherein the electrically conductive line comprises one of a metal, an alloy, and a silicide.

14. The method of claim 1, wherein the electrically conductive line comprises one of aluminum, copper, tungsten, and cobalt.

* * * * *